United States Patent [19]

Ohya et al.

[11] Patent Number: 4,742,031

[45] Date of Patent: May 3, 1988

[54] HIGH FREQUENCY WAVE ABSORBING CERAMICS

[75] Inventors: Nobuyuki Ohya, Nagoya; Toshiki Saburi, Anjo; Toru Yamazaki, Kariya; Taisei Katoh, Aichi, all of Japan

[73] Assignee: Nippondenso Co., Ltd., Kariya, Japan

[21] Appl. No.: 837,404

[22] Filed: Mar. 7, 1986

[30] Foreign Application Priority Data

Apr. 24, 1985 [JP] Japan .................................. 60-88136

[51] Int. Cl.[4] ........................ C04B 35/26; C01G 49/06

[52] U.S. Cl. ..................................................... 501/134

[58] Field of Search .......................... 501/134; 423/633

[56] References Cited

U.S. PATENT DOCUMENTS 813,462 12/1985 Ohya et al. .

813,780 12/1985 Saburi et al. .

4,379,319 4/1985 Wilson ............................ 501/134 X 4,555,494 11/1985 Nishida et al. ...................... 501/134

FOREIGN PATENT DOCUMENTS 0186145 7/1986 European Pat. Off. ............ 501/134

4110500 8/1979 Japan .

4110499 8/1979 Japan .

4110498 8/1979 Japan .

4139098 10/1979 Japan .

4149715 11/1979 Japan .

5010417 1/1980 Japan .

5004827 1/1980 Japan .

1128405 6/1986 Japan .................................. 501/134

OTHER PUBLICATIONS

Ceramic Bulletin, vol. 63, No. 6 (1984), pp. 808–810 and 820.

*Primary Examiner*—William R. Dixon, Jr.

*Assistant Examiner*—J. M. Hunter, Jr.

*Attorney, Agent, or Firm*—Cushman, Darby & Cushman

[57] ABSTRACT

A high frequency wave absorbing ceramics can be used, for example, as an EMI preventive filter for interrupting high frequency waves intruding into electronic circuits. The high frequency wave absorbing ceramics has a composition expressed by the chemical formula $Pb\{Fe_{\frac{1}{2}}Nb_{(\frac{1}{2}-x)}Ta_x\}O_3$ where $0.1<x<0.35$. The high frequency wave absorbing ceramics may be composed of a composition comprising from 30 to 80 mol % of lead iron niobate $Pb(Fe_{\frac{1}{2}}Ta_{\frac{1}{2}})O_3$ based on the total 100 mol % of a $Pb(Fe_{\frac{1}{2}}Nb_{\frac{1}{2}})O_3$ and from 20 to 70 mol % of lead iron tantalate composition composed of lead iron niobate $Pb(Fe_{\frac{1}{2}}Nb_{\frac{1}{2}})O_3$ and lead iron tantalate $Pb(Fe_{\frac{1}{2}}Ta_{\frac{1}{2}})O_3$.

5 Claims, 3 Drawing Sheets

HIGH FREQUENCY WAVE ABSORBING CERAMICS

BACKGROUND OF THE INVENTION

1. Field of the Invention

This invention concerns high frequency wave absorbing ceramics for absorbing high frequency electromagnetic waves.

The ceramics according to this invention can be used, for example, as an EMI (electromagnetic interference) preventive filter for interrupting high frequency waves intruding into electronic circuits.

2. The Prior Art

Heretofore, dielectric materials such as barium titanate have been used for the EMI preventive filters.

However, these materials involve drawbacks in that the attenuating band width at high frequency region is narrow, the high frequency interrupting effect is poor, etc. These drawbacks are attributable to the low specific dielectric constant at high frequency.

SUMMARY OF THE INVENTION

This invention has been achieved in order to improve the foregoing drawbacks in the materials of the prior art and it is an object of this invention to provide a novel high frequency wave absorbing material having a large specific dielectric constant in a frequency region from 1 to 100 MHz and a large dielectric loss in a frequency range from 100 MHz to 1 GHz, that is, providing a significant high frequency interrupting effect in the frequency range from 1 MHz to 1 GHz.

The high frequency wave absorbing ceramics of the present invention has a composition expressed by the chemical formula $Pb\{Fe_{1/2}Nb_{(1/2-x)}Ta_x\}O_3$ where $0.1<x<0.35$. The high frequency wave absorbing ceramics may be an oxide having a perovskite structure, and can comprise from 30 to 80 mol % of lead iron niobate $Pb(Fe_{1/2}Nb_{1/2})O_3$ and lead iron tantalate $Pb(Fe_{1/2}Ta_{1/2})O_3$. tantalate $Pb(Fe_{1/2}Ta_{1/2})C_3$ based on the total 100 mol % of a composition composed of lead iron niobate $Pb(Fe_{1/2}Nb_{1/2})C_3$ *and lead iron tantalate* $Pb(Fe_{1/2}Ta_{1/2})C_3$.

DETAILED DESCRIPTION OF THE INVENTION

This invention concerns a high frequency wave absorbing ceramics which has a composition expressed by the chemical formula $Pb\{Fe_{1/2}Nb_{(1/2-x)}Ta_x\}O_3$ where $0.1<x<0.35$.

The high frequency wave absorbing ceramics of the present invention may be an oxide having a perovskite structure.

The aforementioned composition of the high frequency wave absorbing ceramics of the present invention can comprise from 30 to 80 mol % of lead iron niobate $Pb(Fe_{1/2}Nb_{1/2})O_3$, from 20 to 70 mol % of lead iron tantalate $Pb(Fe_{1/2}Ta_{1/2})O_3$ based on the total 100 mol % of a composition composed of $Pb(Fe_{1/2}Nb_{1/2})O_3$ and $Pb(Fe_{1/2}Ta_{1/2})O_3$.

In this high frequency wave absorbing ceramics, $Fe^{+3}$, $Nb^{+5}$ and $Ta^{+5}$ are irregularly arranged.

According to this invention, the specific dielectric constant of lead iron niobate $Pb(Fe_{1/2}Nb_{1/2})O_3$ is improved by incorporating thereto lead iron tantalate $Pb(Fe_{1/2}Ta_{1/2})O_3$.

The composition within the above specified range has a specific dielectric constant of from 8,000 to 16,000 at 1 MHz at room temperature.

The above-mentioned composition $Pb\{Fe_{1/2}Nb_{(1/2-x)}Ta_x\}O_3$ can be obtained by sintering a powdery mixture which mixes the calcined $Pb(Fe_{1/2}Nb_{1/2})O_3$ and $Pb(Fe_{1/2}Ta_{1/2})O_3$ at a predetermined ratio, or by mixing $PbO$, $Fe_2O_3$, $Nb_2O_5$ and $Ta_2O_5$ at a predetermined ratio and sintering the resultant mixture.

In the case of using the composition according to this invention as the high frequency wave absorbing filter, it is required that the specific dielectric constant at 1 MHz is not less than 8,000 in order to obtain a satisfactory high frequency cut-off property (refer to Japanese Patent Application No. 147,343/1984).

Figure 1:
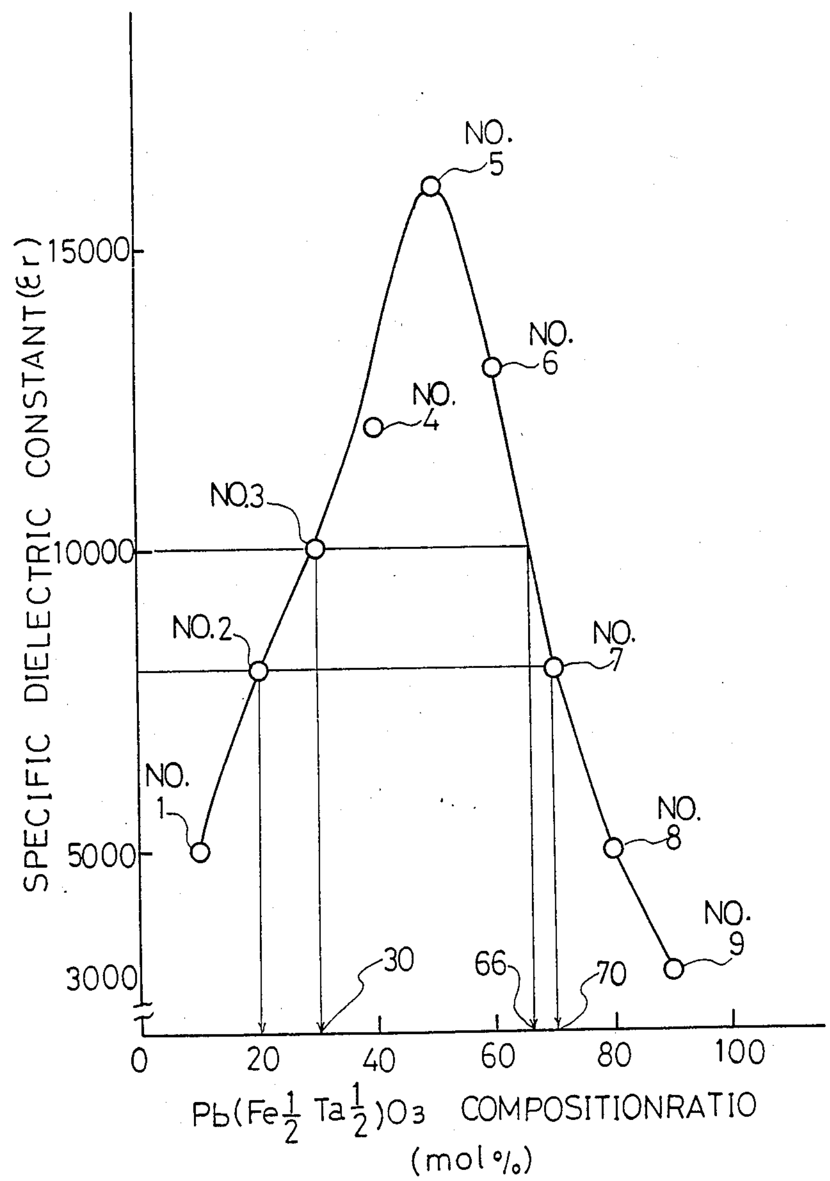
FIG. 1 is a graph showing the relation between the composition ratio of $Pb(Fe_{1/2}Ta_{1/2})O_3$ and the specific dielectric constant ($\epsilon r$).

Accordingly, the composition ratio in the material according to this invention is determined such that it has a specific dielectric constant about 8,000 or more at 1 MHz as shown in Table and FIG. 1, and thus providing a sufficient high frequency wave absorbing effect.

The composition outside of the above-mentioned range is not suitable as the high frequency wave absorbing material since the specific dielectric constant at 1 MHz is less than about 8,000.

Since the material according to this invention comprises a composition having a high specific dielectric constant within the frequency region of from 1 MHz to 100 MHz, it is excellent in the high frequency wave absorbing effect.

EXAMPLES

This invention will now be described referring to specific examples. As the starting material, 4 mol % of lead oxide powder ($PbO$), 1 mol % of iron oxide powder ($Fe_2O_3$) and 1 mol % of niobium oxide powder ($Nb_2O_5$) were blended to thereby obtain a material of lead iron niobate $Pb(Fe_{1/2}Nb_{1/2})O_3$ (hereinafter referred to as "the first ingredient").

Further, 4 mol % of lead oxide powder ($PbO$), 1 mol % of tantalum oxide powder ($Ta_2O_5$) and 1 mol % of iron oxide powder ($Fe_2O_3$) were blended to thereby obtain a material of lead iron tantalate $Pb(Fe_{1/2}Ta_{1/2})O_3$ (hereinafter referred to as "the second ingredient").

Then, these two types of powder mixtures were respectively kneaded in a wet manner for 24 hours each in a plastic resin pot incorporating with agates, then calcined at about 800° C. for one hour, followed by pulverization to thereby obtain the first ingredient powder and the second ingredient powder, respectively.

Then, the first ingredient powder and the second ingredient powder were blended respectively so as to provide the composition ratios: No. 1–No. 9 shown in Table, and mixed in a wet manner to obtain various powdery specimens. Then, after pelletizing the respective powdery specimens with paraffin and then molding under a pressing pressure of 500 kg into a cylinder sized 10 mm$\phi$×5 mm, they were calcined at a temperature of about 1,150° C. for one hour. The molding products were baked at the both end faces thereof with silver paste to form electrodes which used for the measurement of the frequency characteristics of the dielectric constant. The frequency characteristics were measured by using a vector impedance analyzer.

Specimens Nos. 1, 2 and 5 were pressed and sliced into plates of 10×10×0.5 mm in size. Then, in order to form electrodes, silver paste was printed and baked to one entire end face and the opposite end face in lines 2×10 mm. Thus, filters for measuring the high frequency cut-off effect are produced.

For Specimens No. 1–No. 9, the results of the measurement for the specific dielectric constant at 1 MHz under room temperature are shown in Table and FIG. 1.

It is required that the specific dielectric constant is 8,000 or more at 1 MHz to obtain a satisfactory high frequency cut-off effect of the present invention. However, Specimens Nos. 1, 8 and 9 have specific dielectric constants of not more than 5,000, and are not suitable as the high frequency wave absorbing material.

TABLE

| NO. | Composition (mol %) | | Specific Dielectric Constant (1 MHz) |
|---|---|---|---|
| | $Pb(Fe_{\frac{1}{2}}Nb_{\frac{1}{2}})O_3$ | $Pb(Fe_{\frac{1}{2}}Ta_{\frac{1}{2}})O_3$ | |
| 1 | 90 | 10 | 5000 |
| 2 | 80 | 20 | 8000 |
| 3 | 70 | 30 | 10000 |
| 4 | 60 | 40 | 12000 |
| 5 | 50 | 50 | 16000 |
| 6 | 40 | 60 | 13000 |
| 7 | 30 | 70 | 8000 |
| 8 | 20 | 80 | 5000 |
| 9 | 10 | 90 | 3000 |

On the other hand, Specimens Nos. 2–7 which contain from 30 to 80 mol % of $Pb(Fe_{\frac{1}{2}}Nb_{\frac{1}{2}})O_3$ and from 70 to 20 mol % of $Pb(Fe_{\frac{1}{2}}Ta_{\frac{1}{2}})O_3$ have the specific dielectric constants of not less than 8,000. Of these specimens, Specimens Nos. 3–6 which contain 34–70 mol % of $Pb(Fe_{\frac{1}{2}}Nb_{\frac{1}{2}})O_3$ and 66–30 mol % of $Pb(Fe_{\frac{1}{2}}Ta_{\frac{1}{2}})O_3$ have specific dielectric constants as high as not less than 10,000. Especially, Specimen No. 5 which contains 50 mol % of $Pb(Fe_{\frac{1}{2}}Nb_{\frac{1}{2}})O_3$ and 50 mol % of $Pb(Fe_{\frac{1}{2}}Ta_{\frac{1}{2}})O_3$ has a high specific dielectric constant of 16,000.

Figure 2:
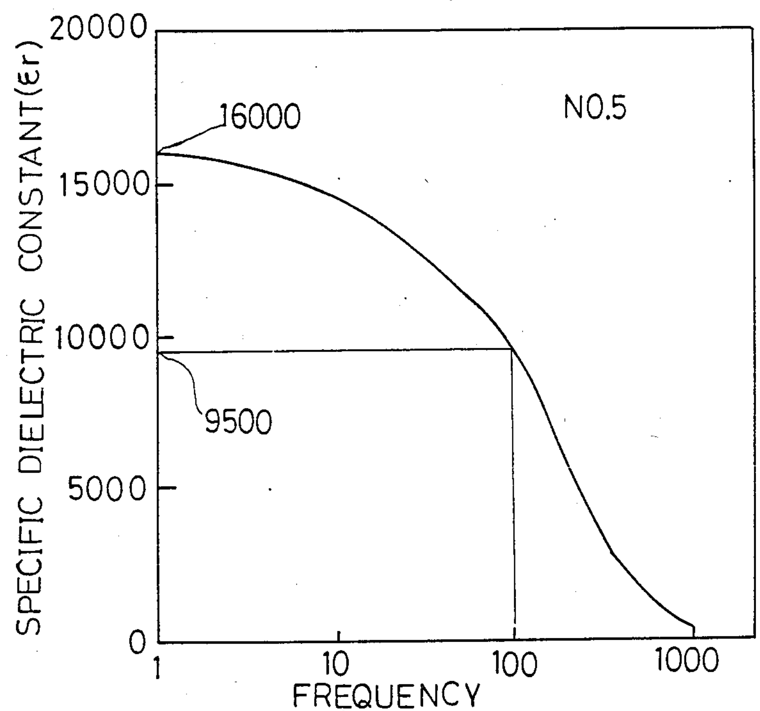
FIG. 2 is a graph showing the characteristics of the specific dielectric constant of the composition of the example (No. 5) of the present invention.

FIG. 2 is a graph showing the frequency characteristics of the specific dielectric constant for Specimen No. 5 within the range from 1 MHz to 1 GHz. As can be seen from this figure, the specific dielectric constant $\epsilon_r$ shows an extremely high value as large as from 9,500 to 16,000 in the range from 1 to 100 MHz.

Figure 3:
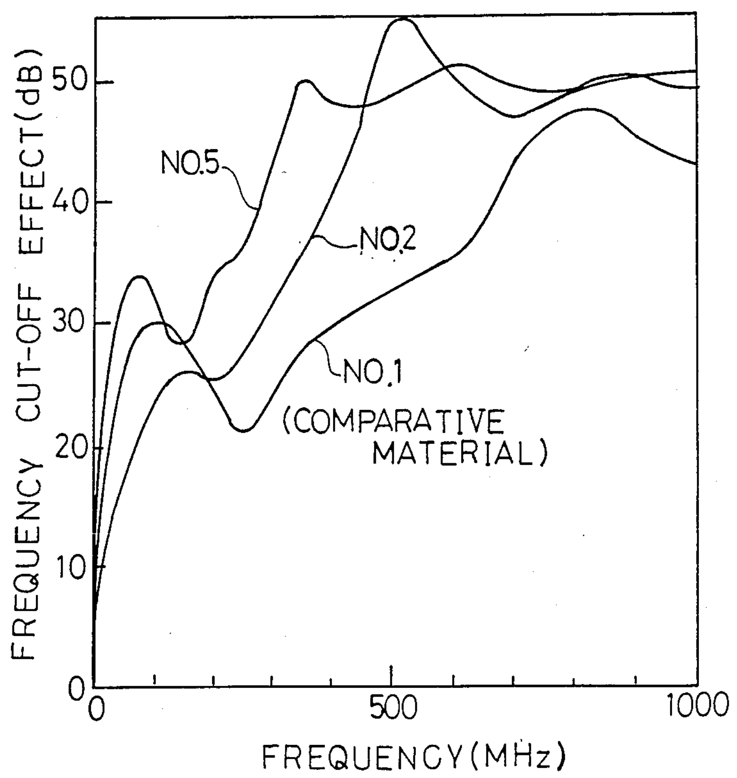
FIG. 3 is a graph showing the high frequency cut-off characteristics of the filters using the example (No. 2, No. 5) of the present invention and the comparative material (No. 1).

FIG. 3 is a graph showing the high frequency cut-off characteristics of the high frequency cut-off filters using Specimens Nos. 1, 2, and 5 at room temperature in the range of 1 MHz to 1 GHz. It is apparent that the filters using Specimens Nos. 2 and 5 have superior high frequency cut-off effects to the filter using Specimen No. 1 (comparative material) whose composition ratio is out of the present invention's range. Of these three specimens, Specimen No. 5 has an excellent high frequency cut-off effect.

Figure 4:
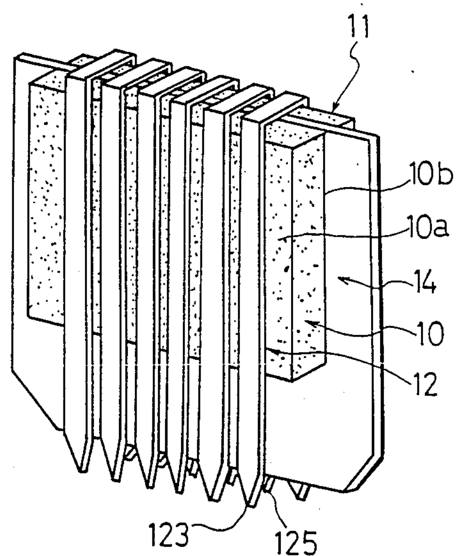
FIG. 4 is a perspective view showing the structure of a high frequency cut-off filter according to the first application example using the material of this invention.
Figure 5:
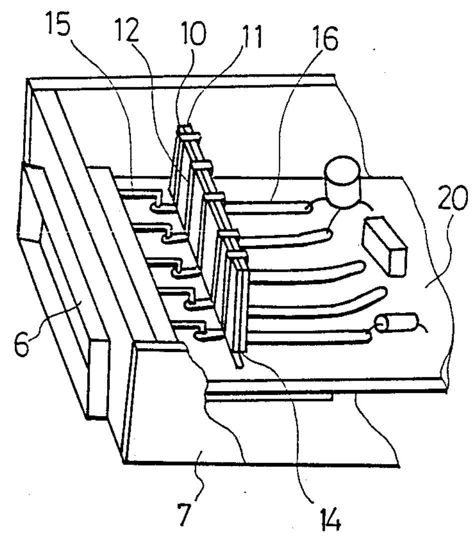
FIG. 5 is a perspective view showing the state of the high frequency cut-off filter according to the first application example disposed to the connector portion.

Next, a first application example of a high frequency cut-off filter using the material according to this invention is shown with reference to FIGS. 4 and 5. FIG. 4 is a perspective view showing the constitution of a high frequency cut-off filter according to the first application example.

A dielectric spacer 10 comprises the composition according to this invention. An electrode 121 is formed at one main surface 10*a* of the dielectric spacer 10 by printing to bake a silver paste in a rectangular form and another electrode is formed at the opposing second main surface 10*b* thereof by printing to bake a silver paste entirely over the end face. One end face of a grounding electrode 14 is disposed with the dielectric spacer 10 so as to be in contact with the electrode, while the other end face is in contact with other dielectric spacer 11 of the same structure as that of the dielectric spacer 10. A plurality of U-shaped lead pins 12 are disposed so as to be in connection with the electrode formed on the first main surface of the dielectric spacers 10, 11, which constitute the signal line electrodes.

In the high frequency cut-off filter of such a constitution, signals are inputted from one terminal 123 of the lead pins, in which the high frequency signals are bypassed by way of the dielectric spacer 10 to the grounding electrode 14, while only the signals at low frequency are taken out from an output terminal 125 as the other terminal of the lead pins 12. In this way, the high frequency noise component can be cut-off.

FIG. 5 is a perspective view showing the high frequency cut-off filter in the first application example shown in FIG. 4 mounted to a connector portion 6. The grounding electrode 14 is connected to a metal case 7 and each one end of the lead pins 12 is connected to a signal line 15, while each of the other ends is connected to a signal line 16 on a circuit board 20 of the electronic device. In this way, the high frequency cut-off filter can be incorporated into a connector portion of electronic equipments.

Figure 6:
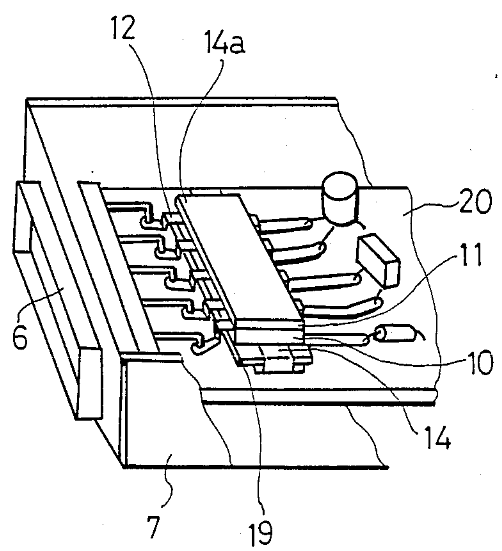
FIG. 6 is a perspective view showing the state of the high frequency cut-off filter according to the second application example disposed to the connector portion.

FIG. 6 is a perspective view where a high frequency cut-off filter according to another application example (a second application example) is disposed to the connector portion 6. The signal line electrode 12 is put between the dielectric spacers 10 and 11. The lower surface of the dielectric spacer 10 is in contact with the grounding electrode 14. The grounding electrode 14 is disposed by way of an insulator plate 19 on a circuit board 20 and further connected electrically to a metal case 7. Further, a grounding electrode 14*a* is formed also on the upper surface of the dielectric spacer 11, which is connected electrically to the metal case 7 in the same manner as described above.

In this way, the signal line electrode is sandwitched between a plurality of dielectric spacers to constitute a parallel capacitor form.

Figure 7:
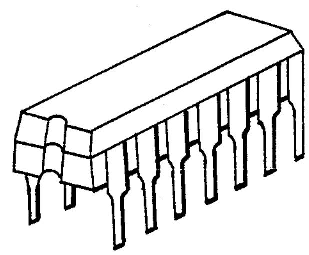
FIG. 7 is a perspective outer view for the high frequency cut-off filter according to another modification embodiment.

Further, it is also possible to apply resin potting the filters of these application examples to constitute as shown in FIG. 7.

What is claimed is:

1. A high frequency wave absorbing ceramics composition having a specific dielectric constant of from 8,000 to 16,000 at 1 MHz at room temperature consisting essentially of $$Pb\{Fe_{\frac{1}{2}}Nb_{(\frac{1}{2}-x)}Ta_x\}O_3$$

wherein $0.1<x<0.35$.

2. The high frequency wave absorbing ceramics according to claim 1, which comprises an oxide having a perovskite structure.

3. The high frequency wave absorbing ceramics according to claim 2, said composition comprising from 30 to 80 mol % of lead iron niobate $Pb(Fe_{\frac{1}{2}}Nb_{\frac{1}{2}})O_3$ and from 20 to 70 mol % of lead iron tantalate $Pb(Fe_{\frac{1}{2}}Ta_{\frac{1}{2}})O_3$ based on the total 100 mol % of a composition composed of lead iron niobate $Pb(Fe_{\frac{1}{2}}Nb_{\frac{1}{2}})O_3$ and lead iron tantalate $Pb(Fe_{\frac{1}{2}}Ta_{\frac{1}{2}})O_3$.

4. The high frequency wave absorbing ceramics according to claim 1, wherein said composition comprises from 34 to 70 mol % of lead iron niobate $Pb(Fe_{\frac{1}{2}}Nb_{\frac{1}{2}})O_3$ and from 30 to 66 mol % of lead iron tantalate $Pb(Fe_{\frac{1}{2}}Ta_{\frac{1}{2}})O_3$ based on the total 100 mol % of a composition composed of lead iron niobate $Pb(Fe_{\frac{1}{2}}Nb_{\frac{1}{2}})O_3$ and lead iron tantalate $Pb(Fe_{\frac{1}{2}}Ta_{\frac{1}{2}})O_3$.

5. The high frequency wave absorbing ceramics according to claim 3, which is prepared by the method comprising mixing:

a powder of lead iron niobate $Pb(Fe_{\frac{1}{2}}Nb_{\frac{1}{2}})O_3$ comprising 4 mol % of lead oxide powder (PbO), 1 mol % of iron oxide powder ($Fe_2O_3$) and 1 mol % of miobium oxide powder ($Nb_2O_5$) and a powder of lead iron tantalate $Pb(Fe_{\frac{1}{2}}Ta_{\frac{1}{2}})O_3$ comprising 4 mol % of lead oxide powder (PbO), 1 mol % of tantalum oxide powder ($Ta_2O_5$) and 1 mol % of iron oxide powder ($Fe_2O_3$), molding and then calcinating them at a temperature of about 1,150° C.

* * * * *